(12) United States Patent
Sritulanont et al.

(10) Patent No.: US 6,359,253 B1
(45) Date of Patent: Mar. 19, 2002

(54) UNIT-IN-TRAY POCKET CHECKER

(75) Inventors: Somboon Sritulanont, Nonthaburi;
Pairoj Panomoupatham, Kalasin;
Amorn Hongmala, Phattalung, all of (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/614,297

(22) Filed: Jul. 12, 2000

(51) Int. Cl.[7] .............................. B23K 26/00; B41J 2/47
(52) U.S. Cl. ............................ 219/121.68; 219/121.69; 347/262
(58) Field of Search ................. 219/121.68, 121.69; 347/224, 262, 264

(56) References Cited

U.S. PATENT DOCUMENTS

| | | | |
|---|---|---|---|
| 3,622,742 A | * 11/1971 | Cohen et al. | 219/121.6 |
| 4,375,025 A | 2/1983 | Carlson | 219/121.68 |
| 4,638,144 A | 1/1987 | Latta, Jr. | 219/121.68 |
| 4,945,204 A | 7/1990 | Nakamura et al. | 219/121.69 |
| 5,357,077 A | 10/1994 | Tsuruta | 219/121.68 |
| 5,410,124 A | * 4/1995 | Jackson | 219/121.68 |
| 5,629,484 A | 5/1997 | Liska | 73/587 |
| 5,838,361 A | * 11/1998 | Corbett | |
| 5,985,377 A | 11/1999 | Corbett | 427/511 |
| 5,986,235 A | 11/1999 | Canella | 219/121.68 |
| 6,031,202 A | 2/2000 | Arakawa et al. | 219/121.68 |

* cited by examiner

Primary Examiner—Geoffrey S. Evans
(74) Attorney, Agent, or Firm—Amin & Turocy, LLP

(57) ABSTRACT

A system and method for laser marking integrated circuit packages is provided. The integrated circuit packages to be marked are positioned within trays. The trays have pockets into which the integrated circuit packages fit. If an integrated circuit package is not properly positioned within a tray pocket, it will stick up. This condition is detected by an electric eye. In a method of the invention, trays loaded with integrated circuit packages are placed on a conveyor. The trays are conveyed under an electric eye the beam of which is broken if, but only if, an integrated circuit package is improperly positioned within a tray pocket. If the beam is broken, a controller stops the conveyor, permitting an operator to deal with the problem. If the beam is not broken, the conveyor takes the tray onward to a laser marking area where all the integrated circuit packages within the tray can be consistently marked.

18 Claims, 2 Drawing Sheets

UNIT-IN-TRAY POCKET CHECKER

TECHNICAL FIELD

The present invention generally relates to semiconductor processing and packaging, and in particular to a system and method for laser marking integrated circuit packages.

BACKGROUND OF THE INVENTION

As the production rate of integrated circuit packages (hereinafter "units") has increased, manufacturers have searched for ways to efficiently and reliably label their units with information such as company name, logo, part number, lot number, and serial number. While ink stamping has been used, laser marking, due to its higher speed, higher precision, and lower cost, has become the preferred method.

A number of laser marking systems have been described. Latta, Jr., U.S. Pat. No. 4,638,144 describes an automated system that laser marks parts loaded in lead frames, which can be stacked into magazines. The frames are carried along a conveyor. Arakawa et al., U.S. Pat. No. 6,031,202 also loads the parts into lead frames, but uses a rotatable index table to transport the frames to the laser marking area. Tsuruta, U.S. Pat. No. 5,357,077, describes a system where the parts are place in tubular holders on a conveyor. In these, and other laser marking systems, there is an unsatisfied need to obtain more consistent marking of all units.

A number of techniques have been proposed to improve marking consistency and to detect defectively marked parts. Liska, U.S. Pat. No. 5,629,484 describes using a sensor to detect the sound of the laser firing and stopping the production line when the laser does not fire as expected. Latta, Jr., U.S. Pat. No. 4,638,144 describes the use of electric eyes to detect when the leading edge of a part has entered the laser marking area and to determine when the flow of parts has been interrupted. However, parts are sometime incorrectly marked because they are not positioned correctly in the laser marking area and there remains an unsatisfied need for more reliable detection of incorrectly positioned parts.

SUMMARY OF THE INVENTION

The present invention provides a system and method for laser marking integrated circuit packages. The integrated circuit packages to be marked are positioned within trays. The trays have one or more pockets into which integrated circuit packages fit. If an integrated circuit package is not properly positioned within a tray pocket, at least a portion of the integrated circuit package sticks up. This condition is detected by an electric eye.

Trays with integrated circuit packages are placed on a conveyor and conveyed under an electric eye. The electric eye is positioned so that the beam of the eye is broken if, but only if, an integrated circuit package is improperly positioned within a tray pocket. If the beam is broken by an improperly positioned integrated circuit package, a controller can stop the conveyor, permitting the system or an operator to properly place the integrated circuit package within its pocket. If the beam is not broken, the conveyor takes the tray onward to a laser marking area where the integrated circuit packages within the tray can be correctly marked.

In one aspect, the invention provides a system for laser marking integrated circuit packages. The system includes a frame, a conveyor, trays for receiving integrated circuit packages, a laser marking device positioned to mark integrated circuit packages in pockets of trays on the conveyor, and an electric eye. The trays are sized to fit on the conveyor and having pockets into which the integrated circuit packages fit. The electric eye is positioned to scan over the conveyor in a line that is just above the plane in which integrated circuit packages will travel when they are fit within pockets of trays on the conveyor.

In another aspect the invention provides a system for laser marking integrated circuit packages, including a frame, a conveyor on the frame, a laser marking device on the frame, the laser marking device being positioned to mark integrated circuit packages traveling on the conveyor, an electric eye mounted on the frame and positioned to scan along a line passing over the conveyor, and a controller operatively linked to the electric eye and the conveyor, wherein the controller is configured to stop the conveyor when an object breaks the line scanned by the electric eye.

In another aspect, the invention provides a system for labeling semiconductor devices, including, a body, a carrying device attached to the body, a laser attached to the body and positioned to label semiconductor devices brought to the laser by the carrying device, a photo-electric sensor attached to the body, above and to one side of the carrying device, a light source positioned above and to the opposite side of the carrying device and shining on the photo-electric sensor, and a logic circuit operatively linked to the photo-electric sensor and the carrying device, wherein the logic circuit initiates an action whenever light from the light source ceases to shine on the photo-electric sensor.

In a further aspect, the invention provides a system for laser marking integrated circuit packages including means for holding integrated circuit packages, means for detecting whether the integrated circuit packages are properly held by the holding means, means for transporting the held integrated circuit packages to a laser marking area, means for positioning the held integrated circuit packages within the laser marking area; and laser marking means within the marking area.

Another aspect of the invention provides a method of laser marking integrated circuit packages, including the steps of loading the integrated circuit packages into a tray having pockets into which the integrated circuit packages fit, putting the tray on a conveyor, either before or after the loading step, conveying the tray under an electric eye that scans over the tray for integrated circuit packages that are not properly seated within the pockets, and laser marking the integrated circuit packages if all the integrated circuit packages are properly seated within tray pockets.

DETAILED DESCRIPTION OF THE INVENTION

Figure 1:
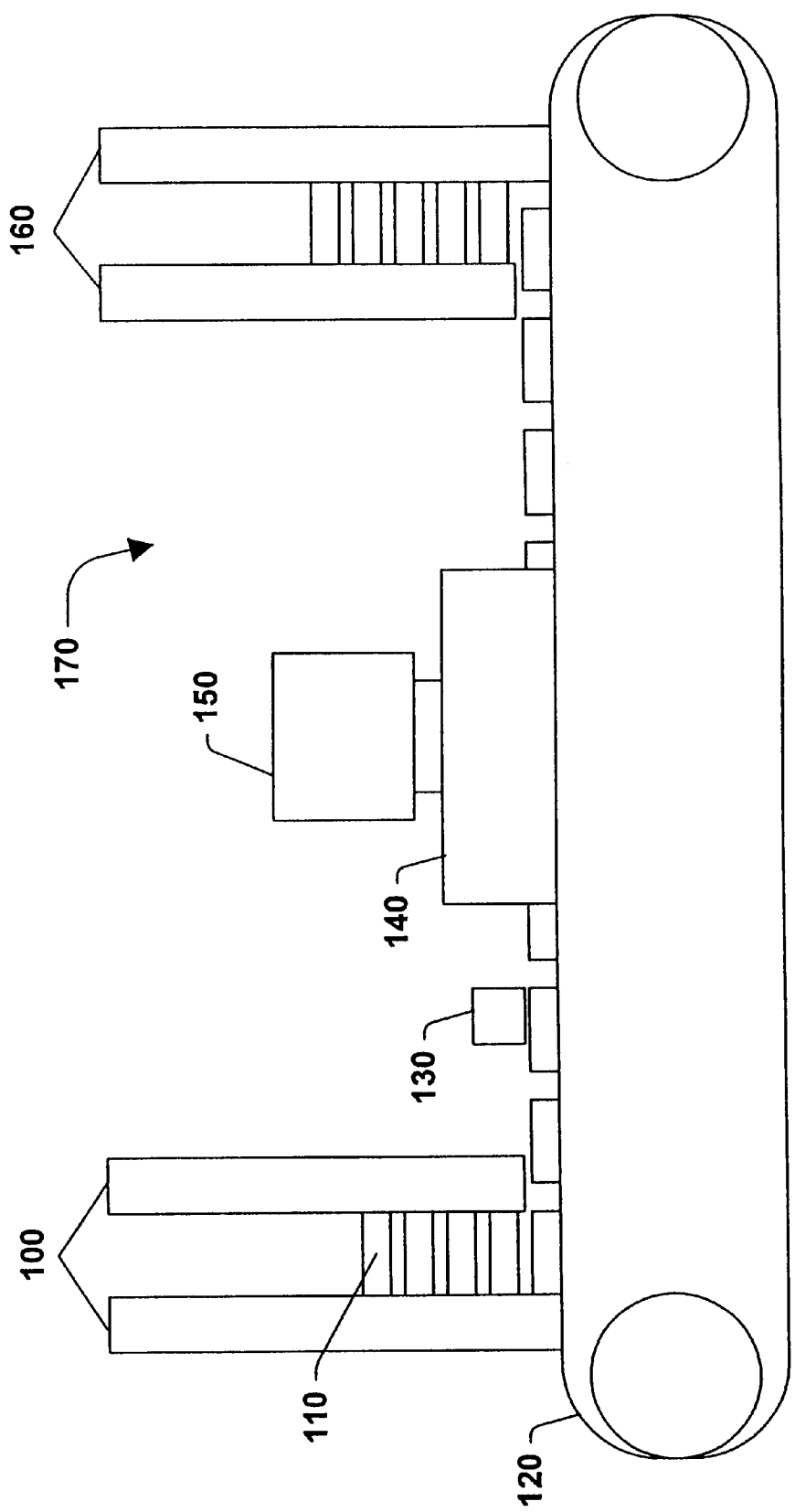
FIG. 1 is a schematic illustration of a laser marking system according to one aspect of the invention.

The present invention will now be described with reference to the drawings, wherein like reference numerals are used to refer to like elements throughout.

FIG. 1 is a schematic of a laser marking device according to one aspect of the invention. The device 170 includes a loader 100, a conveyor 120, an electric eye 130, a laser marking chamber 140, a laser head 150, and an unloader 160. Trays 110 with integrated circuit packages are provided to loader 100, which loads them onto conveyor 120. Conveyor 120 carries trays 110 underneath electric eye 130 and on to laser marking chamber 140. After the integrated circuit packages are marked, conveyor 120 carries trays 110 to unloader 160, which takes trays 110 off conveyor 120.

Loader 100 is a device for queuing trays and positioning them on conveyor 120. Loader 100 may be used to correctly position trays 110 on conveyor 120 for processing in accordance with the present invention. In conjunction with conveyor 120, loader 100 may also assist in properly positioning trays 110 with respect to electric eye 130 and laser head 150. Conveyor 120 may have slots, guides, or other structures that mate with structures formed onto trays 110 to ensure that trays are consistently positioned on conveyor 120. These structures may also facilitate the positioning of trays with respect to electric eye 130 and laser head 150. In embodiments where such structures are used, the loader 100 places trays 110 in mating positions on conveyor 120.

Conveyor 120 may be any device that repeats the operation of carrying trays from one location to another. For example, it may be a belt that carries trays 110 along a straight line from loader 100, under electric eye 130, through laser marking chamber 140, and on to unloader 160 or any sub-route of these stations. It could also be a series of rollers, a series of traveling plates, or a series of traveling clamps. The movement of the conveyor may be either continuous or stepwise. It is also not necessary that the conveyor carry the trays in a straight line.

While it is not necessary that the conveyor carry the trays in a straight line, the conveyor carries the trays past the electric eye in such a manner that the electric eye checks the seating of the integrated circuit packages within the tray pockets. As conveyor 120 carries each tray 110 past electric eye 130, the tray's movement is approximately parallel to the plane of the upper surface of the tray. For example, the conveyor may move the trays in a straight line that is parallel to the upper surface of the tray, as when the tray is flat and is carried along on a broad flat conveyor belt. The conveyor may alternately carry the trays in a curved line past the electric eye, as when the conveyor is a turret having clamps into which the trays fit and the trays rotate under the electric eye as the turret rotates.

Figure 2:
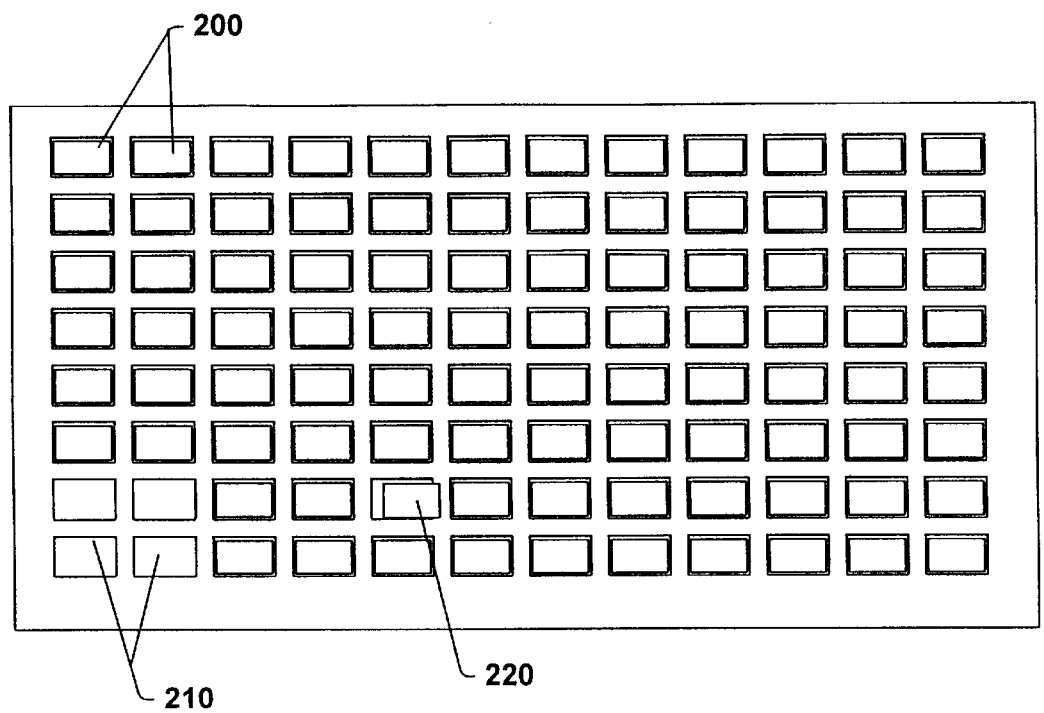
FIG. 2 is a top view of a tray loaded with integrated circuit packages.
Figure 3:
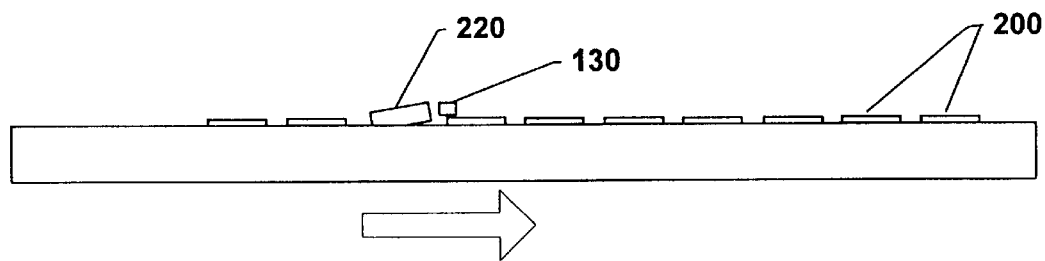
FIG. 3 is a side view of the loaded tray of FIG. 2.

FIG. 2 gives a top view of a typical tray 110 loaded with integrated circuit packages 200. A plurality of integrated circuit packages 200 fit within a plurality of pockets 210, typically one integrated circuit package per pocket. In FIG. 2, there are integrated circuit packages within each of the pockets 210, except for the four in the lower left hand corner of the drawing. While most of the integrated circuit packages 200 are properly seated within pockets 210, integrated circuit package 220 is improperly seated. This condition is often difficult to detect visually, and therefore it is likely to result in a mis-marking of the improperly seated package 220. This condition also causes at least a portion of integrated circuit package 220, in this case the right side of integrated circuit package 220, to lie above the plane of the other integrated circuit packages. This condition is better illustrated in FIG. 3, which is a side view of the loaded tray of FIG. 2.

Electric eye 130 may be any optical switch including a light source and a sensor that senses the interruption of a light beam from the light source. The sensor of the switch may be a photoemissive cell, a photoconductive cell, or a photovoltaic cell. The light source may have any suitable wavelength. Wavelengths from the infrared through the ultraviolet range are preferably used. The light may be monochromatic or polychromatic, coherent or incoherent, and continuous or intermittent.

The light source is positioned to direct light to the sensor along a path just above the path traveled by integrated circuit packages when those packages are properly positioned in the pockets of trays 110 carried along by conveyor 120. The path over which light striking the sensor travels is kept close to conveyor 120. An aperture is useful to define the path of the light so that it forms a beam. The beam strikes the sensor, but is at least partially occluded whenever an improperly seated integrated circuit package in a tray 110 passes electric eye 130. The at least partial occlusion causes the optical sensor to trigger. Careful positioning of the light source, aperture, and sensor relative to the conveyor is generally necessary. Achieving and maintaining this positioning is more easily achieved if conveyor 120 and electric eye 130 are mounted on a common frame. The precise distance above the trays at which light striking the sensor travels is primarily determined by the heights to which properly and improperly placed integrated circuit package typically rises. These distances can be determined by one of ordinary skill in the art. The electric eye usually makes a beam above the maximum height to which properly placed integrated circuit packages rise and below the minimum height to which improperly placed integrated circuit packages generally rise.

Electric eye 130 is operatively coupled to a device that takes action when electric eye 130 is triggered. This device could be an alarm or a logic circuit, but is usually a logic circuit. The logic circuit may take actions such as one or more of sounding an alarm, stopping the conveyor, diverting tray 110 that caused electric eye 130 to trigger, or instituting corrective action. Corrective action, for example, may involve vibrating the tray so as to induce proper seating of the improperly placed integrated circuit package within its pocket. Preferably, electric eye 130 is coupled to a programmable logic circuit and preferably the circuit stops conveyor 120. A programmable logic circuit typically includes a microprocessor and memory containing suitable software instructions.

If electric eye 130 does not trigger, trays 110 proceeds to laser marking chamber 140 where the integrated circuit packages are marked by laser light produced from laser head 150. By fixing the position of laser head 150 relative to trays 110 and fixing the position of integrated circuit packages relative to pockets in trays 110, the position of laser head 150 relative to the integrated circuit packages is fixed and the laser can mark the packages in the correct or intended location. The laser can mark the packages by altering the reflectivity or color of the package material. Optionally, the package material may contain a material that enhances the visibility of the laser markings. The laser itself may be any of those used in laser marking, such as a carbon dioxide or neodymium-yttrium-aluminum garnet laser. The forgoing lasers burn a small amount of material at package surfaces, but it is also possible to use laser/package material combination that result in other types of changes, such as chemical decomposition.

After the integrated circuit packages have been marked, conveyor 120 carries them to unloader 160. Unloader 160 removes trays 110 from conveyor 120 and holds them until they are taken off the laser marking device.

The foregoing system and method is easy to implement and consistently detects improperly seated integrated circuit packages. Using this system, integrated circuit packages rarely, if ever, enter the laser marking area unless they are properly seated within tray pockets. It is comparatively easy to monitor and control the positioning of the trays relative to the laser head, thus the invention provides a simple and reliable system for laser marking integrated circuit packages.

What has been described above is the present invention and several of its specific embodiments. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for laser marking integrated circuit packages comprising:
   a frame;
   a conveyor mounted on the frame;
   trays for receiving integrated circuit packages, each tray having one or more pockets into which integrated circuit packages fit, the trays being sized to fit on the conveyor;
   a laser marking device mounted on the frame, positioned to mark integrated circuit packages traveling on the conveyor in the trays; and
   an electric eye mounted on the frame and positioned to scan over the conveyor in a line that is just above a plane in which integrated circuit packages travel when they are fit within the pockets of the trays and the trays are on the conveyor, wherein the electric eye detects improperly seated integrated circuit packages.

2. The system of claim 1 wherein the conveyor carries the trays in a straight line past the electric eye.

3. The system of claim 2 wherein the conveyor includes a moving belt on which the trays are placed.

4. The system of claim 1 wherein the conveyor includes a rotating turret.

5. The system of claim 1 wherein the conveyor and the trays have structures that mate together.

6. A system for laser marking integrated circuit packages, comprising:
   a frame;
   a conveyor on the frame;
   a laser marking device on the frame, positioned to mark integrated circuit packages traveling on the conveyor;
   an electric eye mounted on the frame and positioned to scan along a line passing over the conveyor; and
   a controller operatively linked to the electric eye and the conveyor, wherein the controller initiates action to correct an integrated circuit package-out-of pocket condition when the electric eye is triggered.

7. The system of claim 6 wherein the controller stops the conveyor when an object breaks a line scanned by the electric eye.

8. The system of claim 6 wherein the conveyor includes a rotating turret.

9. The system of claim 6 wherein the conveyor carries the trays in a straight line past the electric eye.

10. The system of claim 9 wherein the conveyor includes a moving belt on which the trays are placed.

11. The system of claim 6 wherein the conveyor and the trays have structures that mate together.

12. The system of claim 11 wherein the conveyor has slots and the trays have protrusions that fit with the slots.

13. A system for labeling semiconductor devices, comprising:
    a body;
    a carrying device attached to the body;
    a laser attached to the body and positioned to label semiconductor devices brought to the laser by the carrying device;
    a photo-electric sensor attached to the body, above and to one side of the carrying device;
    a light source positioned above and to the opposite side of the carrying device and shining on the photo-electric sensor; and
    a logic circuit operatively linked to the photo-electric sensor and the carrying device;
    wherein the logic circuit initiates an action whenever light from the light source ceases to shine on the photo-electric sensor and the action initiated by the logic circuit is to interrupt the movement of the carrying device.

14. A system for laser marking integrated circuit packages, comprising:
    means for holding integrated circuit packages;
    means for detecting whether the integrated circuit packages are properly held by the holding means;
    means for correcting an integrated circuit package-out-of-pocket condition when the detecting means is triggered;
    means for transporting the held integrated circuit packages to a laser marking area;
    means for positioning the held integrated circuit packages within the laser marking area; and
    laser marking means within the marking area.

15. A method of laser marking integrated circuit packages, comprising the steps of:
    loading the integrated circuit packages into a tray having pockets into which the integrated circuit packages fit;
    putting the tray on a conveyor, either before or after the loading step;
    conveying the tray under an electric eye that scans over the tray for integrated circuit packages that are not properly seated within the pockets; and
    laser marking the integrated circuit packages if all the integrated circuit packages are properly seated within tray pockets.

16. The method of claim 15 further comprising the step of stopping the conveyor if the electric eye detects an improperly seated integrated circuit package.

17. The method of claim 15 wherein the loading step includes assembling integrated circuit packages within tray pockets.

18. The method of claim 15 wherein the step of putting the tray on the conveyor includes mating the tray with a structure on the conveyor that fixes the position of the tray on the conveyor.

* * * * *